United States Patent
Loke et al.

(10) Patent No.: US 9,977,078 B2
(45) Date of Patent: May 22, 2018

(54) SYSTEMS AND METHODS FOR WAFER-LEVEL LOOPBACK TEST

(71) Applicant: QUALCOMM Incorporated, San Diego, CA (US)

(72) Inventors: Alvin Leng Sun Loke, San Diego, CA (US); Thomas Clark Bryan, San Diego, CA (US); Reza Jalilizeinali, Oceanside, CA (US); Tin Tin Wee, San Diego, CA (US); Stephen Robert Knol, San Diego, CA (US); LuVerne Ray Peterson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 613 days.

(21) Appl. No.: 14/339,224

(22) Filed: Jul. 23, 2014

(65) Prior Publication Data
US 2016/0025807 A1    Jan. 28, 2016

(51) Int. Cl.
*G06F 17/50*       (2006.01)
*G01R 31/3177*     (2006.01)
*G01R 31/3185*     (2006.01)
*G01R 31/317*      (2006.01)

(52) U.S. Cl.
CPC ... *G01R 31/3177* (2013.01); *G01R 31/31716* (2013.01); *G01R 31/318513* (2013.01)

(58) Field of Classification Search
USPC ........................................................ 716/110
See application file for complete search history.

(56) References Cited

U.S. PATENT DOCUMENTS

| | | |
|---|---|---|
| 6,421,801 B1 | 7/2002 | Maddux et al. |
| 6,629,274 B1 | 9/2003 | Tripp et al. |
| 6,671,847 B1 | 12/2003 | Chao et al. |
| 7,036,055 B2 | 4/2006 | Muljono |
| 2006/0107154 A1* | 5/2006 | Bansal ............ G01R 31/31716 714/738 |
| 2009/0235218 A1* | 9/2009 | Wahl ..................... G06F 9/3869 716/113 |
| 2012/0017118 A1 | 1/2012 | Barakat et al. |

(Continued)

OTHER PUBLICATIONS

International Search Report and Written Opinion—PCT/US2015/036743—ISA/EPO—dated Sep. 22, 2015.

(Continued)

*Primary Examiner* — Eric Lee
(74) *Attorney, Agent, or Firm* — Haynes and Boone, LLP (36340)

(57) ABSTRACT

Circuits and methods for loopback testing are provided. A die incorporates a receiver (RX) to each transmitter (TX) as well as a TX to each RX. This architecture is applied to each bit so, e.g., a die that transmits or receives 32 data bits during operation would have 32 transceivers (one for each bit). Focusing on one of the transceivers, a loopback architecture includes a TX data path and an RX data path that are coupled to each other through an external contact, such as a via at the transceiver. The die further includes a transmit clock tree feeding the TX data path and a receive clock tree feeding the RX data path. The transmit clock tree feeds the receive clock tree through a conductive clock node that is exposed on a surface of the die. Some systems further include a variable delay in the clock path.

15 Claims, 7 Drawing Sheets

(56) References Cited

U.S. PATENT DOCUMENTS

| | | | |
|---|---|---|---|
| 2012/0087452 A1* | 4/2012 | Zerbe | H04L 25/0264 375/354 |
| 2012/0138927 A1 | 6/2012 | Kang | |
| 2012/0192043 A1* | 7/2012 | Jiang | G01R 31/31716 714/799 |
| 2012/0200330 A1* | 8/2012 | Kawagoe | H03L 7/00 327/161 |
| 2014/0089752 A1 | 3/2014 | Nelson et al. | |

OTHER PUBLICATIONS

Liu C.C., et al., "High Performance Integrated Fan-Out Wafer Level Packaging (InFO-WLP): Technology and System Integration," 978-1-4673-4871-3/12 ©2012, IEEE, pp. IEDM12-323 to IEDM12-326.
Loke A.L.S., et al., "Loopback Architecture for Wafer-Level At-Speed Testing of Embedded HyperTransport (tm) Processor Links", IEEE, Custom Intergrated Circuits Conference (CICC), 2009, pp. 605-608.

* cited by examiner

SYSTEMS AND METHODS FOR WAFER-LEVEL LOOPBACK TEST

TECHNICAL FIELD

This application relates to loopback testing, and more particularly, to a loopback architecture having a transmit data path and a receive data path at each bit of a die.

BACKGROUND

Packaged systems incorporating multiple die are receiving growing interest. Multi-die packages use synchronous die-to-die links to enable high-speed and low-latency communication between die. A die-to-die link must typically support very large aggregate data bandwidth and favors a parallel bus architecture with a forwarded clock for simpler data retiming at the receiver.

Multi-die systems integrated into single packages are increasingly attractive given recent advances in wafer-level package (WLP) technologies. To make such systems cost-effective, Known Good Die (KGDs) are identified at wafer-level test prior to multi-die integration.

One type of test used to identify KGDs includes a loopback test. In a conventional loopback test, a transmitter (TX) on a die sends a test pattern of binary data, which is received by a receiver (RX) on the same die. Thus, the test pattern is sent from a TX to an RX on the same die, or looped back. The received test pattern is then checked for correctness. If the received test pattern is incorrect, that is an indication that the die being tested may not be a good die.

With functional partitioning of a system into several die, the IO (input/output) communication bandwidth requirement between any two die in one direction is not necessarily the same in the reverse direction. This asymmetric bandwidth requirement complicates the hardware requirements to facilitate wafer-level IO loopback testing. There is thus a need in the art for improved loopback testing.

SUMMARY

Circuits and methods for loopback testing are provided. In one example, to enable wafer-level loopback testing, a die incorporates a receiver (RX) to each transmitter (TX) as well as a TX to each RX. In other words, each TX or RX is built as a combined TX-RX transceiver. This architecture is applied to each bit so, e.g., a die that transmits or receives 32 data bits during operation would have 32 transceivers (one for each bit).

Focusing on one of the transceivers, a loopback architecture includes a TX data path and an RX data path that are coupled to each other through an external contact, such as a via at the transceiver. The die further includes a transmit clock tree feeding the TX data path and a receive clock tree feeding the RX data path. The transmit clock tree feeds the receive clock tree through a clock pad that is exposed externally to the die.

In some embodiments, the clock pad includes a variable delay element for maximizing the receiver's ability to retime received data without error. This delay element can be inserted into clock path at the clock TX pad, clock RX pad, or both pads. During testing the delay element can be incrementally adjusted to increase or decrease the amount of delay in the clock path. For instance, the amount of delay can be increased until failure occurs, thereby providing an indication of the amount of retiming margin that the die can accommodate before failure. The more timing margin that can be accommodated, the more likely the die is to be judged a good die. Variable delay elements can also be inserted into the data path at the data TX pad, data RX data path, or both data paths to augment or replace the variable delay element in the clock path. If both data and clock path variable delay elements are present, they can be adjusted accordingly to maximize retiming margin.

In some systems, the delay element may be able to provide a full range of delay over a full bit period or unit interval of time. In such a system, the variable delay element can simply be adjusted up or down during timing testing. In another system the delay element provides a range of delay over half a bit time, and a multiplexer feeding the delay element can output the clock or the inverted clock. In this example, testing is accomplished by using the clock for margin testing a first half of the bit time and using the inverted clock for margin testing the other half of the bit time.

Various embodiments provide one or more advantages over conventional solutions. For instance, in an architecture in which a transmit clock tree feeds the receive clock tree from an externally exposed pad, the receive clock path includes a delay that is similar to that in mission or normal operation mode. Such an architecture also includes the clock pad in the test path, so that a failure of the clock pad can be identified during loopback testing. In another aspect, embodiments that include a variable delay element at the clock pad may provide for more flexibility in margin testing the die. These and other advantages may be better appreciated by the detailed description below.

DETAILED DESCRIPTION

Example Circuit Embodiments

In order to provide a robust loopback test, a proposed design uses a transceiver pair for each bit on the die. In one example, each transmit path is clocked by a transmit clock tree, and each receive path is clocked by a receive clock tree. Further in this example, the transmit clock tree feeds the receive clock tree through an externally exposed clock pad.

Figure 1:
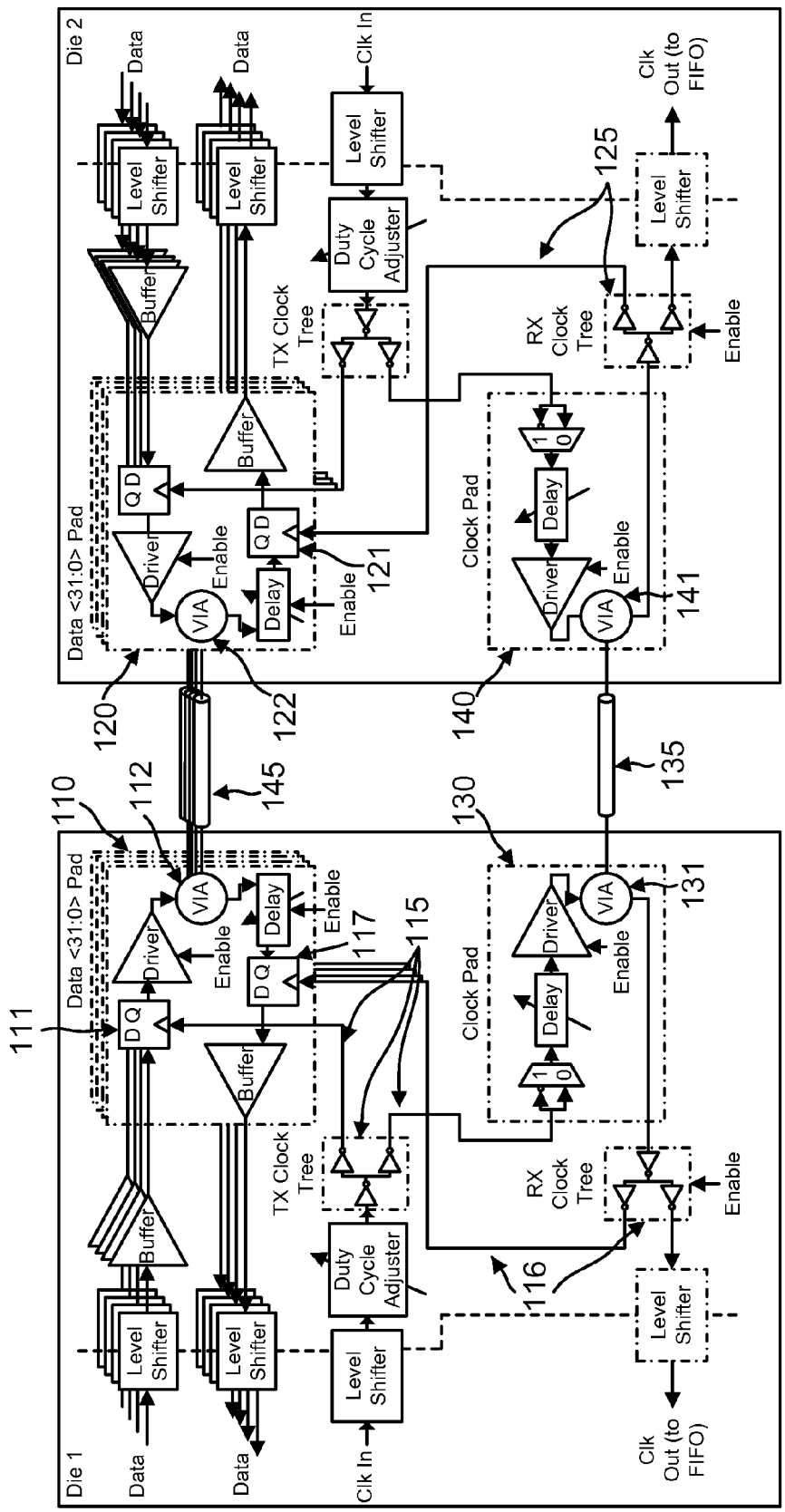
FIG. 1 shows a functional view of an example die-to-die interface, according to one embodiment of the present disclosure.

FIG. 1 shows a functional view of an example die-to-die interface, according to one embodiment of the present disclosure. FIG. 1 is provided to show how a die, such as die 1, may be disposed in a multi-die package to provide for mission-mode operation. Both die 1 and die 2 of the present example include a loopback architecture that can simulate mission mode operation within that same die, even before the die has been cut from a wafer (not shown). The description of FIG. 1 provides an illustration of mission-mode architecture and operation and, after that, provides an illustration of loopback architecture and operation. As noted below, an advantage of some embodiments is that the loopback architecture provides for a realistic assessment of mission-mode operation.

Die 1 includes data pads 110 and clock pad 130. In this example, data pads 110 includes thirty-two data pads (<31:0>) and may be arranged, e.g., in a four-by-eight grid of nodes. Each of the thirty-two data pads may be associated with a particular bit of data on a thirty-two bit-wide data bus. The scope of embodiments is not limited to any specific data bus width.

In this example, die 1 transmits data and clock signals to die 2 during mission mode as follows. Clock pad 130 is used to forward the clock from die 1 to die 2. In this example, the clock reaches via 131, which is externally exposed at die 1 and propagates over clock route 135 to via 141 at clock pad 140.

Die 1 includes transmit clock tree 115, which is shown conceptually in FIG. 1. Transmit clock tree 115 includes buffers to receive the clock (from Clk in), metal routes to data pads 110, and a metal route to clock pad 130. Die 1 also includes receive clock tree 116, which receives a clock through via 131. Receive clock tree 116 is also shown conceptually, and it includes buffers to receive the clock and metal routes to data pads 110. During mission mode, transmit clock tree 115 communicates the clock signal to die 2 by way of via 131 and clock path 135. By contrast, in this example, receive clock tree 116 is used in a loopback test, as explained in more detail below. Via 131 is an example of a conductive clock node exposed on an external surface of die 1.

Focusing on die 2 during mission mode, receive clock tree 125 includes buffers to receive the clock from clock pad 140 and metal routes to distribute the clock to data pads 120. Data pads 120 include thirty-two nodes in this example, where each of the nodes corresponds to one of the nodes of data pads 110. In some examples, data nodes 110 and 120 are arranged in a spatial pattern such that a pair of corresponding nodes (one a transmit node and one a receive node) are similarly placed upon their respective die. Thus, each of the thirty-two data forwarding routes 145 are uniform in length (and match a length of clock forwarding route 135). In fact, die 1 and die 2 are similar to each other in makeup in this example, and die 2 also includes a transmit clock tree 126 that is not used during this example mission mode.

Returning to die 1, during mission mode the clock is distributed by transmit clock tree 115 to the thirty-two data pads 110. Each data pad 110 in this example includes a flip-flop 111, which is storing data. When a given flip-flop 111 receives the clock edge it forwards the data to its respective via 112. Each via 112 (as well as each via 122) is an example of a conductive data node exposed on a surface of its respective die. The data is then transported on a respective data forwarding route 145 to its corresponding node within data pads 120. Both the data and the clock are sent from die 1 to die 2 in this mission mode example, so the clock signal is also passed from transmit clock tree 115 to via 131, clock path 135, via 141 (at clock pad 140), receive clock tree 125, and to respective flip-flops 121. Via 141 is an example of a conductive clock node exposed on an external surface of die 2. The data is received by a respective via 122 and is captured by its respective flip-flop 121 at the clock edge.

Still looking at die 1, during loopback testing a flip-flop 111 in the transmit data path latches out its data at a clock edge and passes its data through respective via 112 and to the receive clock path in the same data pad. Thus a given flip-flop 111 passes its data to a respective flip-flop 117. Flip-flops 111 receive the clock signal from transmit clock tree 115, and flip-flops 117 receive the clock from receive clock tree 116. Transmit clock tree 115 feeds the clock signal to receive clock tree 116 by way of via 131, which in this example includes conductive material that is exposed on the exterior of die 1.

The loopback clock path includes similarities to the mission mode clock path. Referring back to mission mode, transmit clock tree 115 of die 1 clocks flip-flops 111 and also passes the clock signal to die 2. The path of the clock signal from die 1 to die 2 includes clock pad 130 (with via 131), clock route 135, clock pad 140 (with via 141), and receive clock tree 125. The clock signal does not travel instantaneously, but rather is associated with a delay. The delay is referred to herein as t1. Such delay may in some systems be in the range of picoseconds, though the scope of embodiments is not so limited.

Referring now to the loopback mode, the transmit clock tree 115 of die 1 clocks flip-flops 111. However, transmit clock tree 115 does not pass the clock signal directly to receive clock tree 116. Rather, the loopback mode path of the clock includes clock pad 130 (with via 131) before the clock signal reaches receive clock tree 116. The loopback clock path is also associated with a delay, which is referred to herein as t2. The delays t1 and t2 may not be equal, though they may be similar enough that the loopback clock path is a realistic approximation of the mission mode clock path. Also, a clock edge arriving at a given flip-flop 111 also arrives at the matching receive path flip-flop 117 according to the delay t2, thereby allowing flip-flop 117 to capture the data at the clock edge.

Various embodiments may include additional retiming techniques that may invert and/or delay the clock propagation in the clock path so that there is retiming margin when the RX flip-flop is retimed. In an embodiment with full-rate clocking, the system clock the TX flip-flops 111 with the rising edge of the clock and retimes the RX flip-flops 117 with the fall edge of the same clock cycle so that there is approximately half a bit period of retiming margin. The half a bit period of delay can be effectively achieved by either (a) inverting the clock in the clock path (or (b) adding a half bit period delay. In an embodiment with half-rate clocking, the system inserts a half bit period delay in the clock path. Here, both TX and RX flip-flops 111 and 117 are retimed by the same rising edge but there is an intentional half bit period delay plus channel propagation delays (i.e., t1 or t2 depending on mission or loopback mode) in the retiming of the RX flip-flops. Such retiming techniques apply both to mission mode and to loopback mode.

Additionally, the loopback data path includes similarities to the mission mode data path. Referring to the mission mode, the data path includes DATA IN at die 1, the transmit portion of data pads 110 (including flip-flops 111), via 112, data routes 145, via 122 and the receive portion of data pads 120 (including flip-flops 121). Now referring to the loopback test mode, the loopback data path of die 1 includes DATA IN at die 1, the transmit portion of data pads 110 (including flip-flops 111), via 112, and the receive portion of data pads 110 (including flip-flops 117). Thus, the loopback data path includes a full transmit and receive data portion of each of the data pads 110, as well as the respective externally-exposed contacts shown as vias 112.

The loopback architecture of die 1, thus, examines the integrity of a full data path and a full clock path by testing not only the flip-flops 111, 117 but also testing up to and including the externally exposed contacts 112, 131. This is in contrast to conventional loopback architectures that test a transmitter and a receiver with a data path that commonly does not include an externally-exposed contact and a clock path that does not include an externally-exposed contact. The loopback architecture shown in die 1 of FIG. 1 is more robust than such conventional loopback architectures in terms of known good die test coverage.

Figure 2:
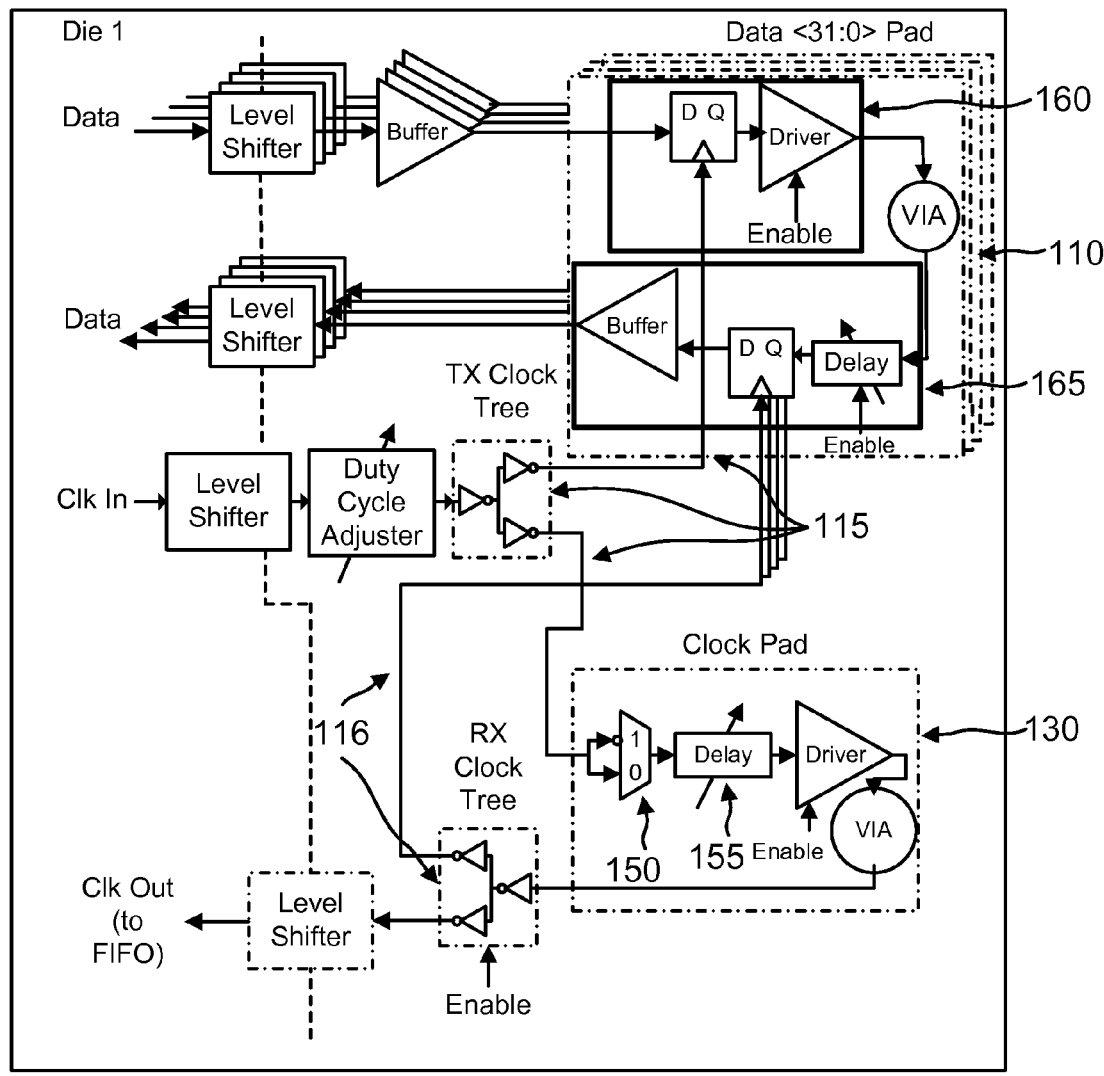
FIG. 2 is an illustration of die 1, of FIG. 1, by itself, according to one example.

FIG. 2 is an illustration of die 1, of FIG. 1, by itself. FIG. 2 is offered to focus on the clock delay of die 1. However, it is understood that the same architecture exists in die 2 of FIG. 1 and that the loopback testing methods discussed herein may be applied just as well to die 2.

Die 1 is illustrated in FIG. 2 as it might exist before assembly in a multi-die package. Thus, FIG. 2 omits data routes 145 and clock route 135. For example, FIG. 2 is illustrative of die 1 as it is included in a wafer before dicing, of after dicing but before packaging processes.

In the example of FIG. 2, clock pad 130 includes adjustable delay element 155 and multiplexer 150. Adjustable delay element 155 adds propagation time from delay t2 (the loopback clock delay). The delay of adjustable delay element 155 may be adjusted using, e.g., a circuit tester, such as a wafer probe tester. Multiplexer 150 selectively passes the clock when it receives a control input of 0 and selectively passes and inverse of the clock signal when it receives a control input of 1.

During one example testing procedure, test data is input at DATA IN and then captured and latched out in transmit data path 160. The test pattern includes a pattern of binary data—in the present example, thirty-two bits per clock cycle. The test data is received from transmit data path 160 by receive data path 165 where it is captured and then clocked out to DATA OUT. The clock is provided to transmit data path 160 by transmit clock tree 115 and is provided to receive clock path 165 by receive clock tree 116. As in FIG. 1, transmit clock tree 115 provides the clock signal to receive clock tree 116 through clock pad 130.

An external circuit tester may provide the test data at DATA IN, capture the data at DATA OUT, and compare the data. Assuming there are no errors, the test data at DATA OUT should match the test data at DATA IN. However, there may be some instances in which the input test data does not match the captured test data. For example, manufacturing defects in the transmit path 160, the receive path 165, the clock trees 115 and 116, external contacts 112 and 131, and/or the clock pad 130 may cause detectable data errors. Such detectable data errors may occur at a flip-flop, e.g., when a clock edge arrives either early or late compared to the width of a binary one or zero in the data.

It may be the case that any two otherwise identical die are somewhat different due to expected manufacturing tolerances, where manufacturing processes may cause a die to have less room for error. For instance, two otherwise identical die may appear to perform similarly and pass a test as described above. But when clock signals on the die are adjusted slightly, one die may begin producing data errors whereas the other die may continue to operate error-free. Various techniques according to the present disclosure timing margin stress test the die to determine which die have narrower bands of error-free operation, and those die showing relatively narrower bands of error-free operation may be eliminated as not KGDs.

In one example, data is clocked in and then captured at the output as the adjustable delay 155 is stepped through its range of delay. For instance, the testing equipment, such as a wafer probe tester, may be used to control the delay at adjustable delay element 155, and the delay may be adjustable in discrete steps as per digital control. The testing equipment tracks where errors occur to determine the available timing margin of the die.

In another example, the available range of delay of adjustable delay element is approximately equal to one-half of a data bit width, where the data bit width is the time period during which a single one or zero is present at an input of a flip-flop. The example system of FIGS. 1 and 2 includes adjustable delay element 155 in the clock path with a programmable inversion function provided by multiplexer 150.

Continuing with the example, the testing machine applies a repeating pattern (e.g., a pseudorandom bit sequence, PRBS, pattern) that stresses the timing and signal integrity of the path and incrementally increases the delay until the pattern fails. The machine then selects 1 on multiplexer 150 to invert the clock and applies the test pattern again.

Pass/fail results may have a pattern similar to a pppppppp/fff/pppppp/fff/ppppp/ff sequence (where p is a pass for a specific delay and f is a fail). The number of steps per bit time can be determined by counting the number of delay steps from a p/f boundary to a p/f boundary and the timing margin (the figure of merit being measured) can be determined by dividing the number of "p's" by the number of steps per bit time. The step may further include a threshold for a minimum timing margin that is acceptable for a good die.

Of course, other tests may be performed, so the timing margin test may or may not be determinative of a KGD. In any event, the testing regimen identifies the KGDs from other die. Also, the testing described above may be performed while die 1 is still embodied in a wafer, after the wafer is cut but before packaging, and/or after packaging.

The adjustable delay testing technique described above may provide one or more advantages over conventional techniques. For instance, the addition of the adjustable delay 155 may allow for a comprehensive timing margin test over a range of clock delay. Furthermore, the ability to select a clock or an inverse clock may allow the use of a smaller adjustable delay circuit.

The examples of FIGS. 1 and 2 above are provided for illustrative purposes, and it is understood that the scope of embodiments is not limited to the specific embodiments shown above. For instance, a die may have any appropriate number of bits (whether thirty-two, fifty, or another number). Also, the flip-flops at the nodes may operate on either a rising or falling clock edge, as appropriate. Furthermore, while FIGS. 1 and 2 shows flip flops, any appropriate sequential logic circuit may be used in various embodiments.

Figure 3:
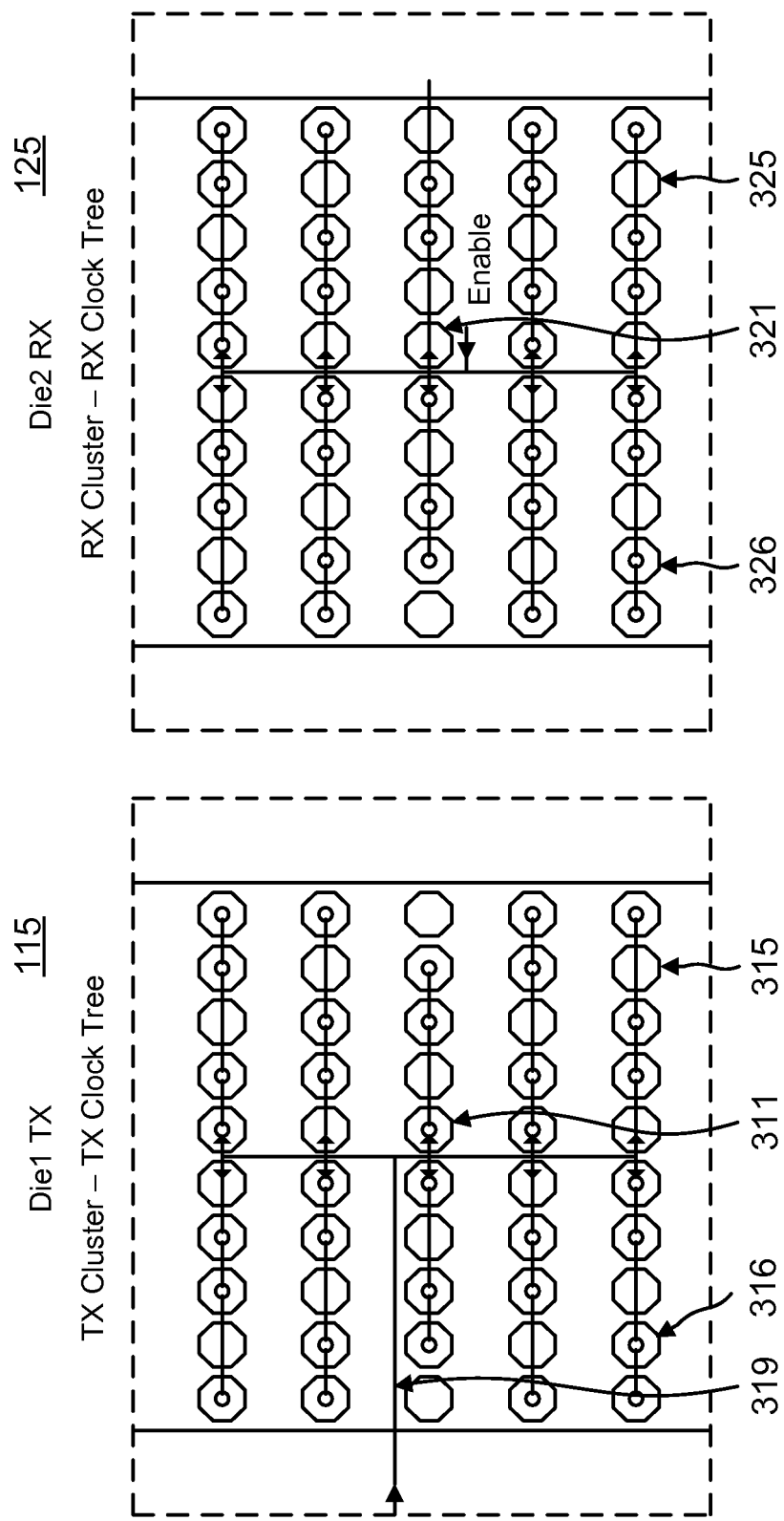
FIG. 3 is an illustration of two die, each with its own respective clock tree, according to one example.

FIG. 3 is an illustration of die 1 and 2, each with its own respective clock tree 115 (transmit) and 125 (receive, as in FIG. 1), according to one example. FIG. 3 illustrates a mission mode arrangement, where die 1 transmits the clock to die 2. In FIG. 3, some nodes on the die are clocked for data transfer, whereas other nodes are used for other purposes.

For instance, tree 115 includes a clock-in branch 319 that receives the clock. Tree 115 has node 311, which is a clock node. A clock forwarding route (not shown) is used to send the clock to node 321, where the clock is distributed through tree 125. Other nodes (e.g., nodes 315 and 325) are used for power, such as Vss or Vdd. In FIG. 3, only those nodes that are clocked are marked with a dot in the middle. The nodes marked with a dot (other than nodes 311 and 321) are associated with data bits.

Although not shown herein, die 1 also includes a receive clock tree (illustrated as tree 116 of FIGS. 1 and 2). In some examples, tree 116 may have a similar topology as tree 115, serving the same nodes on die 1, but being disposed on a different metal layer. In loopback mode, tree 115 transmits the clock signal to the receive clock tree (not shown) through an externally-exposed conductor, as explained above.

Figure 4:
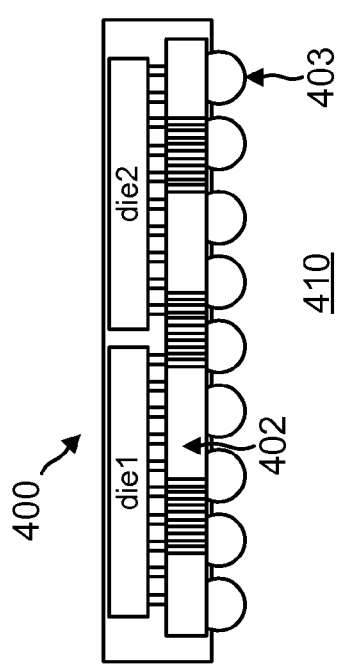
FIG. 4 includes two views 410 and 420 of a multi-die wafer-level package according to one example.
Figure 4:
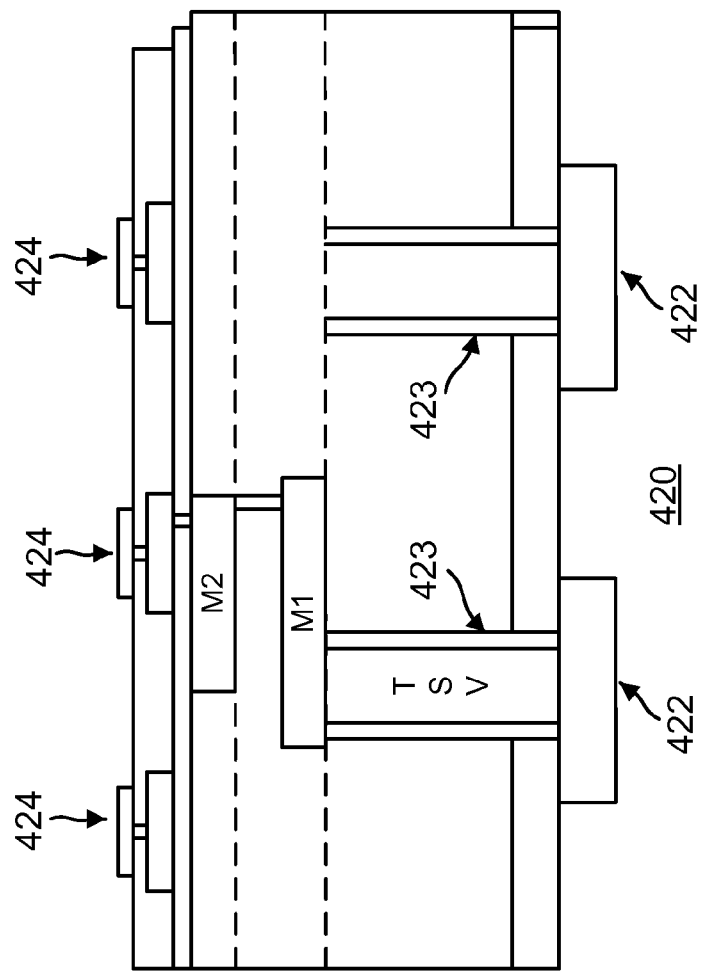

The die of FIGS. 1-3 may be included in a multi-die package. FIG. 4 shows one example multi-die package adapted according to one embodiment, which may accommodate two die.

FIG. 4 includes two views 410 and 420. View 410 is a side view of package 400, which includes die 1 and die 2. View 420 is a cut-away view of a portion of interposer 402 that serves die 1.

Focusing on view 410, die 1 and die 2 are in communication with each other by data and clock forwarding routes (not shown) as explained in more detail above. Die 1 and 2 are also in communication with solder balls on an external surface of package 400. One example solder ball 403 is marked in view 410, and view 410 shows nine solder balls in this side view. Die 1, die 2, and interposer 402 are encapsulated in package 400 according to any appropriate packaging technique now known or later developed. The scope of embodiments is not limited to any particular packaging technique.

View 420 shows a cross section of a portion of interposer 402. Solder balls 422 correspond to two of the solder balls shown in view 410 (e.g., solder ball 403). Balls 422 are in communication with metal layers M1 and M2 by through silicon vias (TSVs) 423. Structures 424 are in communication with metal layers M1 and M2 as well as with data and/or clock pads of the die 1 and 2. Thus, the interposer 402 provides for communication between the die and the solder balls and for communication between the die themselves. For example, the metal layers M1 and M2 may be used to provide communication between the die, where communication between the die includes the data forwarding routes and the clock forwarding routes of FIG. 3.

Figure 5:
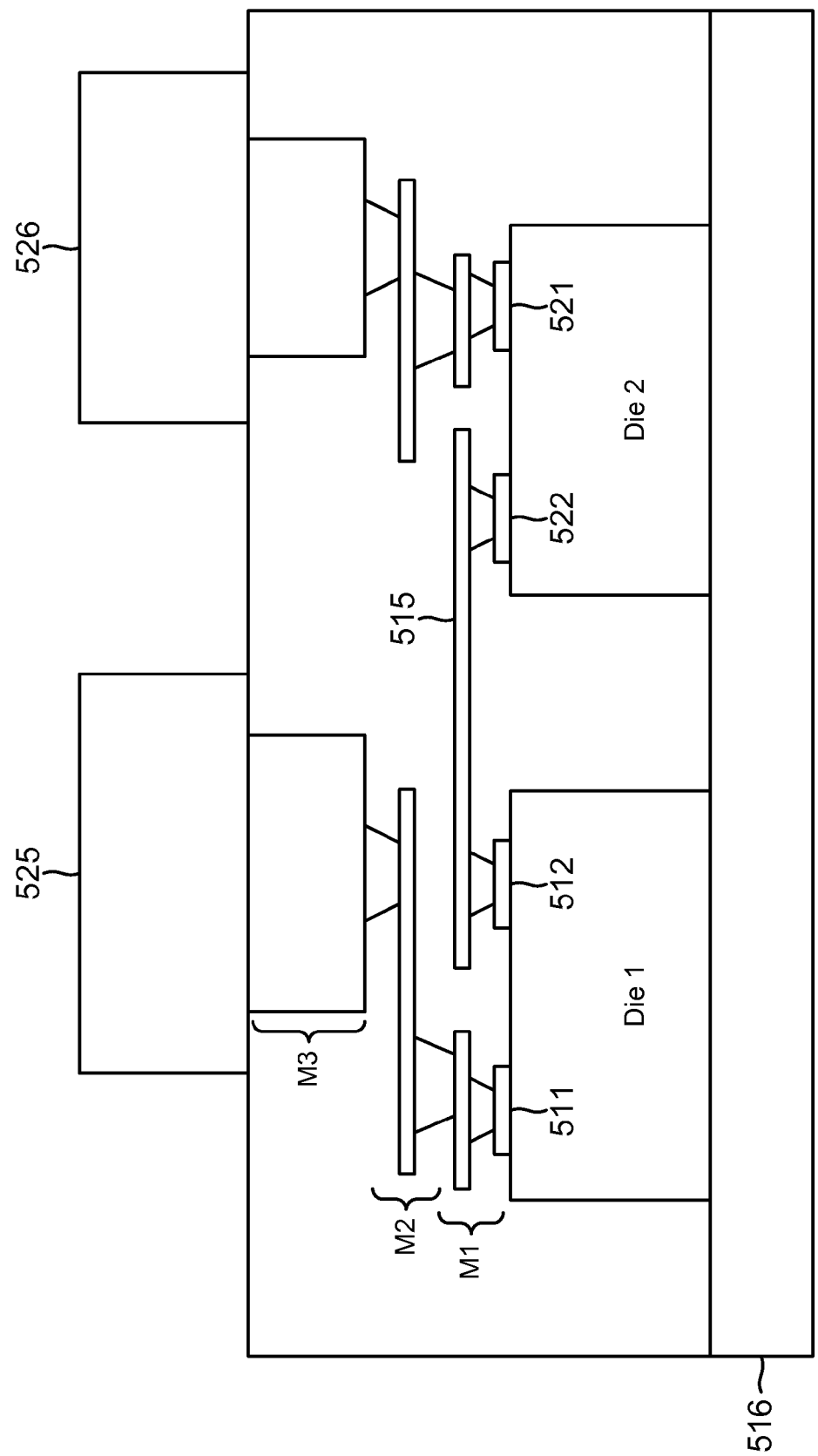
FIG. 5 is an illustration another example multi-die wafer-level package, adapted according to one embodiment.

FIG. 5 is an illustration another example multi-die wafer-level package 500, adapted according to one embodiment. In the example of FIG. 5, die 1 and die 2 are disposed upon semiconductor substrate 516, and the package is grown upon die 1, die 2, and substrate 516 using appropriate semiconductor manufacturing processes. For instance, layers of dielectric are grown, then partially etched away to accommodate deposition of metal layers. Metal layers M1, M2, and M3 are shown in FIG. 5, and it is understood that metal layers M1, M2, and M3 are built upon layers of dielectric. After the dielectric layers and metal layers are formed, solder balls 525 and 526 are formed on the exterior surface of the package. The package thus includes die 1, die 2, multiple dielectric and metal layers, and external solder balls.

Package 500 differs from package 400 (FIG. 4) in that the package is "grown" upon die 1 and 2 using semiconductor manufacturing processes (e.g., deposition, etching, sputtering, etc.) rather than being assembled from multiple separate parts that are encapsulated together using traditional packaging techniques (e.g., adhesives and the like).

In this example, die 1 includes pads 511, 512, and die 2 includes pads 521, 522. Data pads 512 and 522 are data pads (e.g., like individual ones of the pads 110 and 120 of FIG. 1) that share data using metal data route 515. Pads 511 and 521 are in communication with solder balls 525 and 526, respectively, through metal layers M1-M3. Clock trees are not shown explicitly in the embodiment of FIG. 5, but it is understood that the clock trees can be formed in the on-chip interconnect metal layers (not shown).

FIG. 5 is for example only, and it is understood that other embodiments may include many more metal layers and many more solder balls in a particular package. Also, packages may include more than two die.

Example methods of use for the circuits of FIGS. 1 and 2 will now be discussed.

Example Methods of Use

Figure 6:
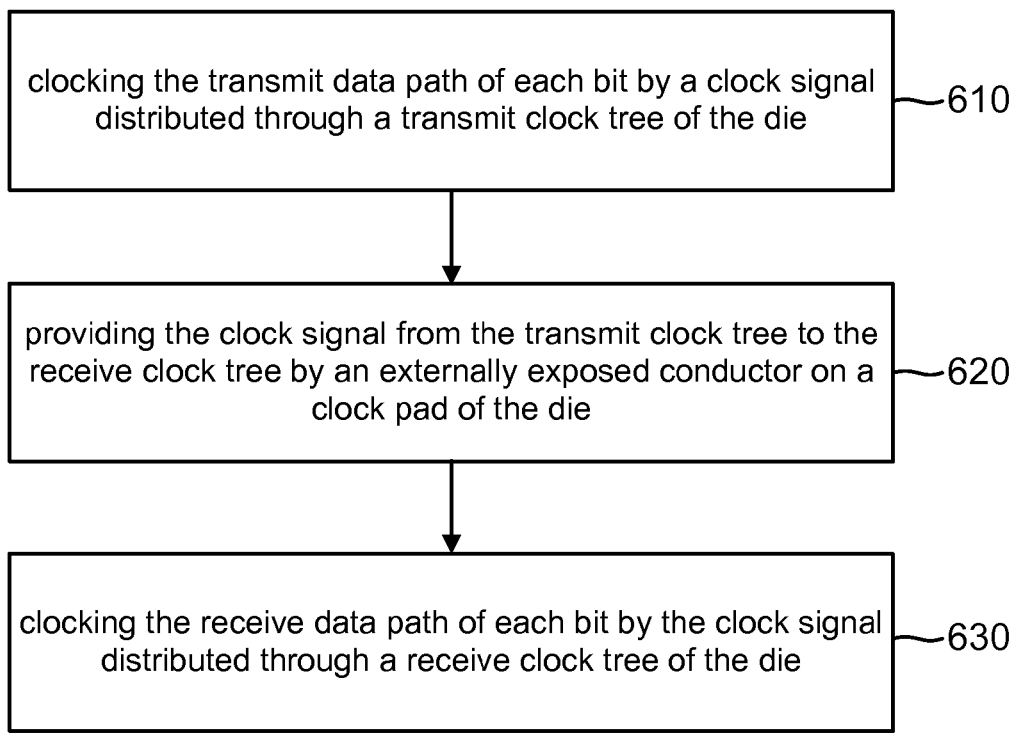
FIG. 6 is a flow diagram for an example method for operating a transmit path and a receive path in a loopback architecture on a die, according to one embodiment.

FIG. 6 is a flow diagram for an example method 600 for operating a transmit path and a receive path in a loopback architecture on a die, according to one embodiment. The method 600 may be performed on the die shown in FIGS. 1 and 2. The clocking may be performed by an external tester or by a clock on the die. Furthermore, method 600 may be performed on-wafer, on a die that has been cut from a wafer but has not been packaged, or on a die that is included in a package (e.g., a multi-die package).

Consistent with FIGS. 1 and 2, method 600 is performed on a die having multiple bits, where each of the individual bits has a transmit data path coupled to a receive data path through an externally exposed data node (e.g., a via 112 of FIG. 1). Pads, bumps, pillars, and vias are examples of conductive nodes that can be exposed on a surface of a die for either data or clock signals.

The method begins in a block 610, which includes clocking the transmit data path of each bit by a clock signal distributed through a transmit clock tree of the die. In the examples of FIGS. 1 and 2, the clock is received at the transmit clock tree and from there is provided to the transmit flip-flops of the bits.

At block 620, the transmit clock tree provides the clock signal to the receive clock tree by an externally exposed conductor on a clock pad of the die. For instance, in the example of FIGS. 1 and 2, via 131 is included in clock pad 130. Via 131 includes metal or other conductive material that is exposed on a surface of the die and can be used to transmit the clock signal to another die. Via 131 is also positioned between the transmit clock tree and the receive clock tree and is in electrical communication with both.

Block 630 includes clocking the receive data path of each bit by the clock signal distributed through a receive clock tree of the die. For instance, in the embodiment of FIGS. 1 and 2, the receive flip-flops 117 receive the clock signal from the receive clock tree.

The scope of embodiments is not limited to the specific method shown in FIG. 6. Other embodiments may add, omit, rearrange, or modify one or more actions. For instance, in some examples, the actions of blocks 610-620 are performed in the context of die testing, so other actions to implement testing may be additionally carried out. Testing is described below with respect to FIG. 7. Furthermore, in a die that is clocked, the actions of blocks 610-630 are not performed serially, but rather are performed continuously and concurrently as the die transfers digital bits of information from DATA IN to DATA OUT.

Figure 7:
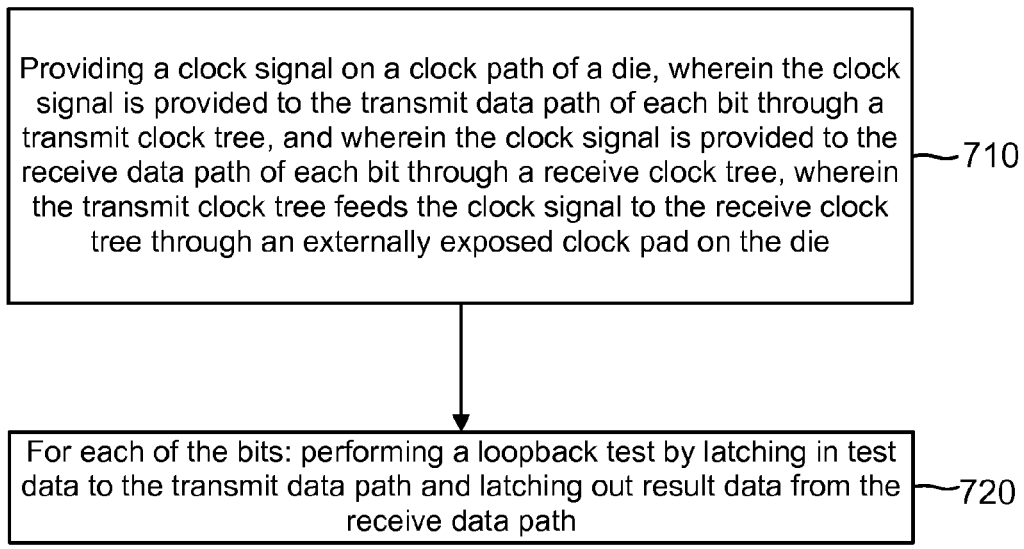
FIG. 7 is a flow diagram for an example method for performing loopback testing on a die, according to one embodiment.

FIG. 7 is a flow diagram for an example method 700 for performing loopback testing on a die, according to one embodiment. The method 700 may be performed on the die shown in FIGS. 1 and 2. The testing may be performed by an external tester, which provides testing input data to the die, captures output testing data from the die, and determines whether the die is suitable for use based at least in part on the testing. Furthermore, method 700 may be performed on-wafer, on a die that has been cut from a wafer but has not been packaged, or on a die that is included in a package (e.g., a multi-die package).

Similar to method 600, method 700 is performed in the context of a semiconductor die that has multiple bits, where each bit has a transmit data path coupled to a receive data path through an externally exposed data node, such as a vias 112.

Block 710 includes providing a clock signal on a clock path of a die. In this example, the clock path includes both a transmit clock tree and a receive clock tree. The clock signal is provided to the transmit data path of each bit through the transmit clock tree and is provided to the receive data path of each bit through the receive clock tree.

Further in this example, the transmit clock tree feeds the clock signal to the receive clock tree through an externally exposed clock node on the die. In the embodiment of FIGS. 1 and 2, the clock pad 130 includes via 131, which electrically couples transmit clock tree 115 and receive clock tree 116.

Block 720 includes for each of the bits: performing a loopback test by latching in test data to the transmit data path and latching out result data from the receive data path. In one embodiment, the loopback test includes a signal integrity test, where the captured data is compared to the input data, and mismatches between the two sets may indicate failure.

In one example, block 720 includes performing loopback testing without changing a delay of the clock path. In another example, block 720 includes adjusting the delay to the clock signal in the receive clock tree and recording whether the receive data path correctly captures data from the transmit data path over a range of delay values. In this example, an adjustable delay element such as element 155 of FIG. 2 can be stepped through a range of discrete delay steps, where each of the steps incrementally changes a propagation time of the clock signal to the receive clock tree. Various embodiments can include any appropriate range of adjustability. Adjusting the delay during a loopback test may help identify timing failure margins of the die.

In another example, the clock pad further includes the adjustable delay element between the transmit clock tree and the receive clock tree and also a multiplexer. The multiplexer selects either the clock signal or an inverted clock signal to supply to the adjustable delay element.

Continuing with the example, block 720 includes, for a sequence of binary data: adjusting the delay to the clock signal in the receive clock tree and recording whether the receive data path correctly captures data from the transmit data path, selecting the inverted clock signal at the multiplexer, adjusting the delay to the inverted clock signal in the receive clock tree, and recording whether the receive data path correctly captures data from the transmit data path. Such actions may be repeated one or more times.

This example is a variation on the adjustable delay testing embodiment described above. However, instead of stepping through an entire desired range of delay, in this example, the available range of adjustable delay may be approximately half of a desired range. The adjustable range of delay provided by the delay element is effectively doubled by stepping through the range of delay with a clock signal and then stepping through the range of delay again but with an inverted clock signal. In one example the available range of delay may include approximately one-half of the time-domain width of a data signal bit. Stepping through the range twice, with the clock signal and then the inverse clock signal, thus provides approximately a full time-domain width of a data signal bit.

The scope of embodiments is not limited to the specific method shown in FIG. 7. Other embodiments may add, omit, rearrange, or modify one or more actions. For instance, in some examples, the actions of blocks 710-730 are not performed serially, but rather are performed continuously and concurrently as the die transfers digital bits of information from DATA IN to DATA OUT.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
a die having:
   a plurality of data nodes, each of the data nodes associated with a respective bit of data, each data node being associated with a transmit data path and a receive data path;
   a transmit clock tree feeding a clock signal to the respective transmit data path of each data node; and
   a receive clock tree feeding the respective receive data path of each data node;
wherein the transmit clock tree feeds the clock signal to the receive clock tree through a conductive clock node exposed on a surface of the die, further wherein the transmit clock tree, the receive clock tree, and the conductive clock node form a loopback clock path contained within the die.

2. The circuit of claim 1, wherein each bit includes its transmit data path and its receive data path coupled directly to each other through an externally exposed conductor to form a loopback data path.

3. The circuit of claim 1, wherein each transmit data path comprises a flip flop receiving the clock signal from the transmit clock tree.

4. The circuit of claim 1, wherein each receive data path comprises a flip flop receiving the clock signal from the receive clock tree.

5. The circuit of claim 1, wherein the die further includes an adjustable delay element between the transmit clock tree and the receive clock tree.

6. The circuit of claim 1, wherein the die further includes an adjustable delay element between the transmit clock tree and the receive clock tree, the adjustable delay element in communication with a multiplexer, the multiplexer adapted to select either a clock or an inverted clock to supply to the adjustable delay element.

7. The circuit of claim 1, wherein the die is disposed in a multi-die package with an additional die, wherein the die and the additional die share a data connection for each bit.

8. The circuit of claim 7, wherein each bit includes its transmit data path and its receive data path coupled directly to each other through a conductor exposed on a surface of the die, further wherein the data connection for each bit utilizes the conductor exposed on the surface of the die for the bit.

9. The circuit of claim 1, wherein the die is disposed in a multi-die package with an additional die, wherein the die is adapted to transmit the clock signal to the additional die through the conductive clock node.

10. A multi-die package comprising:
a first die and a second die, the first die having:
- a plurality of data nodes, each of the data nodes associated with a respective bit of data, each data node having a transmit data path and a receive data path directly connected to each other through a conductor externally exposed on the die;
- a conductive clock node exposed on a surface of the first die;
- a transmit clock tree coupled to a clock input and configured to distribute a clock signal to the transmit data path of each of the data nodes; and
- a receive clock tree coupled to the transmit clock tree through the conductive clock node and configured to distribute the clock signal to the receive data path of each of the data nodes, wherein the transmit clock tree, the receive clock tree, and the conductive clock node form a loopback clock path contained within the first die.

11. The multi-die package of claim 10, wherein each transmit data path comprises a flip flop receiving the clock signal from the transmit clock tree.

12. The multi-die package of claim 10, wherein each receive data path comprises a flip flop receiving the clock signal from the receive clock tree.

13. The multi-die package of claim 10, wherein the first die further includes an adjustable delay element between the transmit clock tree and the receive clock tree.

14. The multi-die package of claim 10, wherein the first die further includes an adjustable delay element between the transmit clock tree and the receive clock tree, the adjustable delay element in communication with a multiplexer, the multiplexer selecting either the clock signal or an inverse clock signal to supply to the adjustable delay element.

15. The multi-die package of claim 10, wherein the first die is adapted to transmit the clock signal to the second die through the conductive clock node.

\* \* \* \* \*